(12) United States Patent
Oh et al.

(10) Patent No.: US 7,622,738 B2
(45) Date of Patent: Nov. 24, 2009

(54) DISPLAY DEVICE HAVING A MULTI-LAYER CONDUCTIVE LAYER AND MANUFACTURING METHOD THEREFORE

(75) Inventors: Joon-hak Oh, Gyeonggi-do (KR); Keun-kyu Song, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 218 days.

(21) Appl. No.: 11/638,270

(22) Filed: Dec. 12, 2006

(65) Prior Publication Data

US 2007/0134832 A1 Jun. 14, 2007

(30) Foreign Application Priority Data

Dec. 13, 2005 (KR) ............... 10-2005-0122752

(51) Int. Cl.
*H01L 29/04* (2006.01)
(52) U.S. Cl. ............... 257/59; 257/40; 257/72; 257/E21.002; 257/E33.001; 438/30; 438/133; 438/158
(58) Field of Classification Search ............ 257/57–59, 257/72, 368, 347; 438/30, 133
See application file for complete search history.

(56) References Cited

U.S. PATENT DOCUMENTS 6,674,106 B2 * 1/2004 Tanaka et al. ............... 257/222
6,821,811 B2 11/2004 Hirakata et al.
7,208,756 B2 * 4/2007 Shih et al. ............... 257/40
2005/0045885 A1 3/2005 Kim et al.
2005/0279999 A1 * 12/2005 Lee et al. ............... 257/66
2006/0214154 A1 * 9/2006 Yang et al. ............... 257/40

FOREIGN PATENT DOCUMENTS

JP 2004-080026 3/2004
JP 2004-146430 5/2004
KR 1020050023012 3/2005

OTHER PUBLICATIONS

English Language Abstract, KR Patent First Publication No. 1020050023012, Mar. 9, 2005, 1 page.
English Language Abstract, JP Patent First Publication No. 2004-080026, Mar. 11, 2004, 1 page.
English Language Abstract, JP Patent First Publication No. 2004-146430, May 20, 2004, 1 page.

* cited by examiner

*Primary Examiner*—Dung A. Le
(74) *Attorney, Agent, or Firm*—Innovation Counsel LLP

(57) ABSTRACT

An display device having a thin film transistor with improved characteristics comprising a gate conductor including a gate electrode formed on an insulating substrate; a gate insulating layer formed on the gate electrode; a conductive layer comprising a plurality of layers including a source electrode and a drain electrode formed on the gate insulating layer and separated from each other across the gate electrode to define a channel region; and an organic semiconductor layer formed in the channel region, wherein the conductive layer comprises a metal layer and a transparent electrode layer.

11 Claims, 15 Drawing Sheets

DISPLAY DEVICE HAVING A MULTI-LAYER CONDUCTIVE LAYER AND MANUFACTURING METHOD THEREFORE

CROSS-REFERENCE TO RELATED APPLICATIONS

This application claims the benefit of Korean Patent Application No. 2005-0122752, filed on Dec. 13, 2005, in the Korean Intellectual Property Office, the contents of which are hereby incorporated by reference as if fully set forth herein.

FIELD OF THE INVENTION

The present invention relates to a display device and, more particularly, to a display device comprising an organic thin film transistor (OTFT) and a manufacturing method therefor.

DESCRIPTION OF THE RELATED ART

Flat display devices including liquid crystal display (LCD) and organic light emitting diode (OLED) displays employ thin film transistors (TFTs) to form an image. The TFT is a switching and driving element for controlling and driving the operation of each pixel. A TFT comprises a gate electrode, a gate insulating layer covering the gate electrode and a semiconductor layer disposed on the gate insulating layer. The semiconductor layer comprises amorphous silicon or poly silicon and, more recently, organic semiconductors are used.

An organic semiconductor (OSC) is formed at normal temperature and pressure and may be formed by an ink-jet printing process, without need for coating, exposing and developing processes, by forming a wall to encompass an area where the organic semiconductor is disposed, i.e., a channel region. The wall has an opening to expose the channel region. Then, an organic semiconductor solution is jetted to the channel region through the opening and the solvent is removed from the organic semiconductor solution, thereby forming the organic semiconductor.

However, because the TFT is a very small element it is not easy to properly jet the organic semiconductor solution to the opening. The organic semiconductor solution may not be jetted to the proper place but may be deposited on the wall, for example. Accordingly, the thickness of the organic semiconductor layer may be different on each pixel, and thus characteristics of the organic semiconductor may not be uniform. To solve this problem, the surface of the wall is treated so as to be water and oil repellent.

However, the characteristics of the gate insulating layer disposed under the organic semiconductor layer may be changed by the surface treatment, and thus the characteristics of TFT comprising the organic semiconductor layer may be adversely affected.

SUMMARY OF THE INVENTION

A display device comprises gate conductor and a gate electrode formed on an insulating substrate; a metal layer formed by applying metal on the gate conductor; a transparent electrode layer advantageously formed of amorphous ITO or IZO on the metal layer, the transparent electrode layer having advantageously been patterned using a chrome etchant so as to be divided into two parts across the gate electrode and then annealed so as to become polycrystal; the metal layer being patterned using the transparent electrode as a blocking layer to define a channel region which is divided into two parts across the gate electrode; and an organic semiconductor layer formed in the channel region. Data conductor is formed on the insulating substrate and an intermediate insulating layer formed on the data conductor before forming the gate conductor. A first wall is formed on the intermediate insulating layer so as to have a first opening exposing the gate electrode and a gate insulating layer is formed in the first opening covering the gate electrode.

The gate insulating layer is advantageously formed in the first opening by an ink-jet method. A second wall is formed on the transparent electrode layer to provide a second opening exposing the channel region. The second wall is surface-treated after the annealing and before the patterning the metal layer. The organic semiconductor layer is advantageously formed in the second opening by an ink-jet method.

The surface-treating is performed by at least one of an $O_2$ plasma treatment process, a $CF_4$ plasma treatment process and a self-assembled monolayer (SAM) process.

A passivation layer is formed on the organic semiconductor layer.

BRIEF DESCRIPTION OF THE DRAWING

The foregoing and other objects, features and advantages of the present invention may become more apparent from the ensuing description when read together with the drawing, in which:

FIGS. 3A through 3L illustrate a manufacturing method of a display device according to the first embodiment of the present invention.

DETAILED DESCRIPTION

Figure 1:
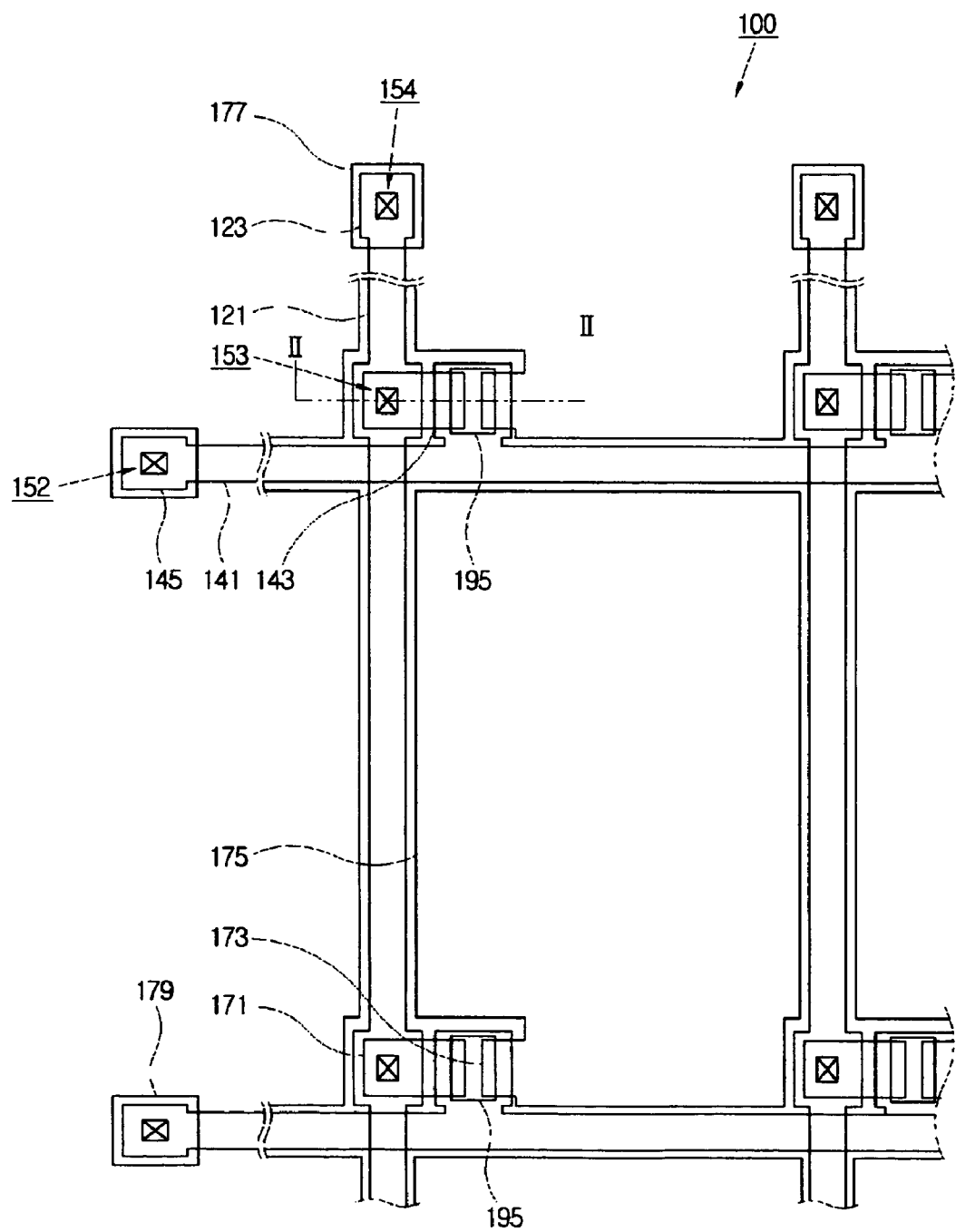
FIG. 1 is an arrangement view of a TFT substrate according to a first embodiment of the present invention.

A TFT assembly 100 according to the present invention comprises an insulating substrate 110, data conductors 121, 123, an intermediate insulating layer 130, gate conductors 141, 143, 145, a first wall 150, a gate insulating layer 155, source electrodes 161, 171 and drain electrodes 163, 173. Data conductors 121, 123 are formed on insulating substrate 110, intermediate insulating layer 130 is formed on data conductors 121, 123, and gate conductors 141, 143, 145 are formed on layer 130. Wall 150 has an opening 151 to expose at least a portion of gate conductors 141, 143 and 145. Gate insulating layer 155 is formed in opening 151. Source electrodes 161, 171 and drain electrodes 163, 173 are separated from each other across gate electrode 143 to define a channel region C.

TFT substrate assembly 100 comprises conductive layers 161, 163, 171, 173, 175, 177 and 179, a second wall 180 and an organic semiconductor layer 190. Conductive layers 161, 163, 171, 173, 175, 177 and 179 comprise a plurality of layers. Second wall 180 has an opening 181 to expose channel region C located on conductive layers 161, 163, 171, 173, 175, 177 and 179, a portion of the source electrodes 161, 171 and a portion of drain electrodes 163, 173. Organic semiconductor layer 190 is formed in the opening 181.

Insulating substrate 110 may be of glass or plastic. If insulating substrate 110 is made of plastic, the TFT substrate assembly 100 will be flexible but may easily be affected by heat. However, if organic semiconductor layer 190 in the first embodiment is formed at normal temperature and pressure, a plastic substrate may be used without difficulty. The plastic may be polycarbonate, polyimide, polyethersulfone (PES), polyarylate (PAR), polyethylene naphthalate (PEN), polyethylene terephthalate (PET), etc.

Data conductors 121, 123 are formed on insulating substrate 110. Data conductors 121, 123 comprises a data line 121 extending in one direction and a data pad 123 disposed at an end portion of the data line 121 to receive a driving signal and a control signal from the outside. Data pad 123 receives the driving signal and the control signal and transmits them to data line 121. Data conductors 121, 123 comprises at least one of aluminum (Al), chrome (Cr), molybdenum (Mo), aurum (Au), platinum (Pt), palladium (Pd), copper (Cu) and aluminum neodymium (AlNd). Further, data conductors 121, 123 may have a single layer or a multilayer comprising at least one of the aforementioned materials.

In the present invention, data conductors 121, 123 are first formed on insulating substrate 110 followed by intermediate insulating layer 130 which covers data conductors 121, 123. Data conductors 121, 123 may have a single layer or a multilayer.

Insulating layer 130 electrically insulates data conductors 121, 123 from gate conductors 141,143 and 145. Layer 130 may be either an organic layer of a material having excellent durability or an inorganic layer having excellent process efficiency. In another exemplary embodiment, the intermediate insulating layer may be a multilayer comprising an inorganic layer of silicon nitride (SiNx) or silicon oxide (SiOx) which has excellent process efficiency disposed under an organic layer. The inorganic layer may be omitted depending on the process efficiency of the organic layer.

An insulating layer contact hole 131 and a contact hole (not shown) are formed in insulating layer 130 to expose a portion of data line 121 and data pad 123. Covering data conductors 121, 123 with insulating layer 130 reduces the possible degradation of organic semiconductor layer 190 that may be caused by the chemicals or plasma used for the forming of data conductors 121, 123 which chemicals may remain and diffuse into the interface between the insulating layer contact hole 131, contact hole 153 or opening 151.

Gate conductors 141, 143 and 145 are formed on insulating layer 130. Gate conductors 141, 143 and 145 comprises a gate line 141, a gate pad 145 and a gate electrode 143. Gate line 141 is insulated from and crosses data line 121 to define a pixel region. Gate pad 145 is disposed at an end portion of gate line 141 to receive a driving signal or a control signal from the outside. Gate electrode 143 is branched from gate line 141 and formed corresponding to organic semiconductor layer 190, which will be described later. Gate pad 145 receives driving and control signals from the outside to turn the TFT on/off and transmit them to gate electrode 143 through gate line 141. Gate conductors 141, 143 and 145 comprises at least one of Al, Cr, Mo, Au, Pt, Pd, Cu and AlNd as well as data conductors 121, 123. Wall 150 is formed on the intermediate insulating layer 130. Wall 150 comprises wall contact hole 153 and opening 151 exposing at least a portion of gate conductors 141, 143 and 145. In detail, wall 150 comprises opening 151 exposing the gate electrode 143, wall contact hole 153 formed corresponding to the insulating layer contact hole 131 and exposing a portion of data line 121, and contact holes 152 and 154 each exposing data pad 123 and gate pad 145. Wall 150 is provided to form gate insulating layer 155 by an ink-jet method and may comprise a photoresist organic layer. A larger opening 151 is preferred in order to keep a planarized surface of the gate insulating layer 155 on the gate electrode 143. A gate insulating layer material is jetted through opening 151. The solvent is removed from the material to form gate insulating layer 155. During the solvent removing process, gate insulating layer 155 dries and becomes a plate shape, i.e., thick in the peripheral area, and thin and flat in the middle area,. This is called a coffee stain phenomenon. When gate insulating layer 155 has different thicknesses depending on its positions on gate electrode 143 because of the coffee stain phenomenon, the characteristics of the TFT may be degraded. Thus, opening 151 is formed to be large so that the peripheral area, which is thick, will overlap gate electrode 143 to a minimal extent. Accordingly, the TFT characteristics will be minimally affected.

Gate insulating layer 155 is formed in opening 151. Gate insulating layer 155 insulates data conductors 121, 123 from gate conductors 141, 143 and 145 and prevents impurities from diffusing into organic semiconductor layer 190 which is easily affected by chemicals and plasma. Gate insulating layer 155 may be a thick layer comprising at least one of acrylic resin, polystyrene resin and benzocyclobutene, which have low dielectric constant. Preferably, gate insulating layer 155 according to the present invention comprises material which is excellent in durability and has low dielectric constant so as to minimize capacitances $C_{gs}$ and $C_{gd}$ between source electrode 171 and gate electrode 143 and between drain electrode 173 and gate electrode 143, thereby improving the characteristics of the organic TFT. It is preferable that gate insulating layer 155 have a relative dielectric constant between 1 and 3.

Conductive layers 161, 163, 171, 173, 175, 177 and 179 are formed on wall 150 and gate insulating layer 155. Conductive layers 161, 163, 171, 173, 175, 177 and 179 are multi-layers in which metal layers 161 and 163 are disposed in the lower part and transparent electrode layers 171, 173, 175, 177 and 179 disposed in the upper part. Metal layers 161 and 163 and transparent electrode layers 171, 173, 175, 177 and 179 are electrically interconnected. Metal layers 161 and 163 comprise at least one of Al, Cr, Mo, Au, Pt, Pd, Cu and AlNd, and the transparent electrode layers 171, 173, 175, 177 and 179 comprise a transparent conductive material such as indium tin oxide (ITO) or indium zinc oxide (IZO). For example, metal layers 161 and 163 may comprise chrome (Cr) and molybdenum (Mo), or aluminum (Al). the transparent electrode layers 171, 173, 175, 177 and 179 may comprise amorphous ITO.

Conductive layers 161, 163, 171, 173, 175, 177 and 179 are connected to data line 121 through insulating layer contact hole 131 and wall contact hole 153. Conductive layers 161, 163, 171, 173, 175, 177 and 179 comprise source electrodes 161, 171 contacted with at least a portion of organic semiconductor layer 190, drain electrodes 163, 173 separated from source electrodes 161, 171 across gate electrode 143, and pixel electrode 175 connected to drain electrodes 163, 173. Also, conductive layers 161, 163, 171, 173, 175, 177 and 179 further comprise data pad contact member 177 connected to data pad 123 and gate pad contact member 179 connected to gate pad 145. Source electrode 171 is physically and electrically connected to data line 121 through insulating layer contact holes 131 and wall contact holes 153 to receive an image signal. Drain electrodes 163, 173 is separated away from source electrodes 161, 171 across gate electrode 143 to define a channel region C. Drain electrodes 163, 173 and source electrodes 161, 171 form a TFT switching and driving element to control the operation of each pixel electrode 175.

Wall 180 is formed on source electrodes 161, 171 and drain electrodes 163, 173. Wall 180 encompasses the channel region C and comprises opening 181 to expose a portion of the source electrodes 161, 171 and a portion of the drain electrodes 163, 173. Wall 180 functions as a mold to form organic semiconductor layer 190.

Organic semiconductor layer 190 is formed in opening 181. Organic semiconductor layer 190 covers the channel region C and contacts with at least a portion of the source electrodes 161, 171 and a portion of drain electrodes 163, 173. Organic semiconductor layer 190 comprises one of a derivative including substituent of tetracene or pentacene; 4~8 oligothiopene connected to 2, 5 position of thiopene ring; perylenetetracarboxilic dianhidride or an imide derivative thereof; naphthalenetetracarboxilic dianhydride or an imide derivative thereof; metallized pthalocyanine or a halogenated derivatives thereof, or perylene, coroene or derivatives including substituents thereof; co-oligomer or co-polymer of thienylene and vinylene; thiopene; perylene or coroene, or derivatives including substituents thereof; and derivatives including one or more hydrocarbon chains of 1~30 carbons to aromatic or heteroaromatic ring of the aforementioned materials. Alternatively, organic semiconductor layer 190 may comprise any well-known organic semiconductor material.

In another exemplary embodiment, organic semiconductor layer may be formed by an evaporation method or a coating method. In this case, wall 180 does not need to be formed.

A passivation layer 195 is formed on organic semiconductor layer 190. Passivation layer 195 is a single layer as shown in drawings, but may be a double layer. Passivation layer 195 prevents the characteristics of the organic semiconductor layer 190 from being deteriorated and comprises fluoric polymer, polyvinyl alcohol (PVA), or the like. When passivation layer 195 is a double layer, it may comprise fluoric polymer in the lower layer and one of the ITO and IZO in the upper layer.

Hereinafter, a manufacturing method of a display device according to the first embodiment of the present invention will be described with reference to FIGS. 3A through 3L.

Figure 3A:
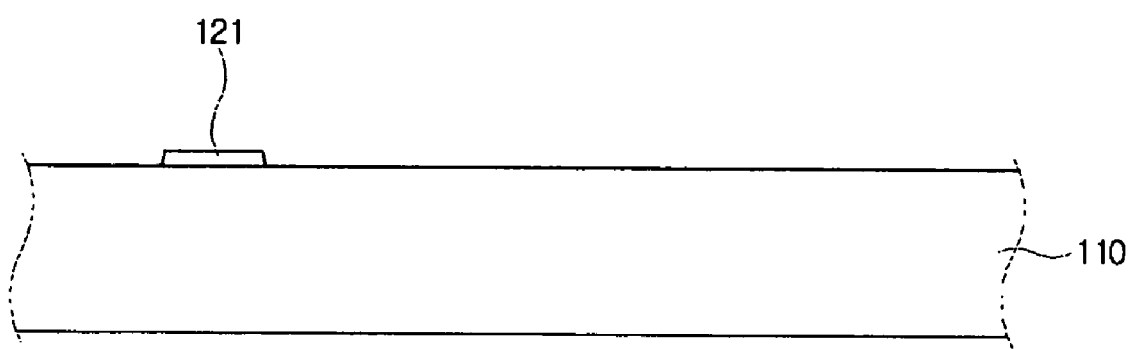

Referring to FIG. 3A, insulating substrate 110 comprises an insulating material such as glass, quartz, ceramic or plastic. It is preferable that a plastic substrate is used for manufacturing a flexible display device. A data conductor material is deposited on insulating substrate 110 by a sputtering method or the like and etched by photolithography to form data line 121 and data pad 123 (See FIG. 1).

Figure 3B:
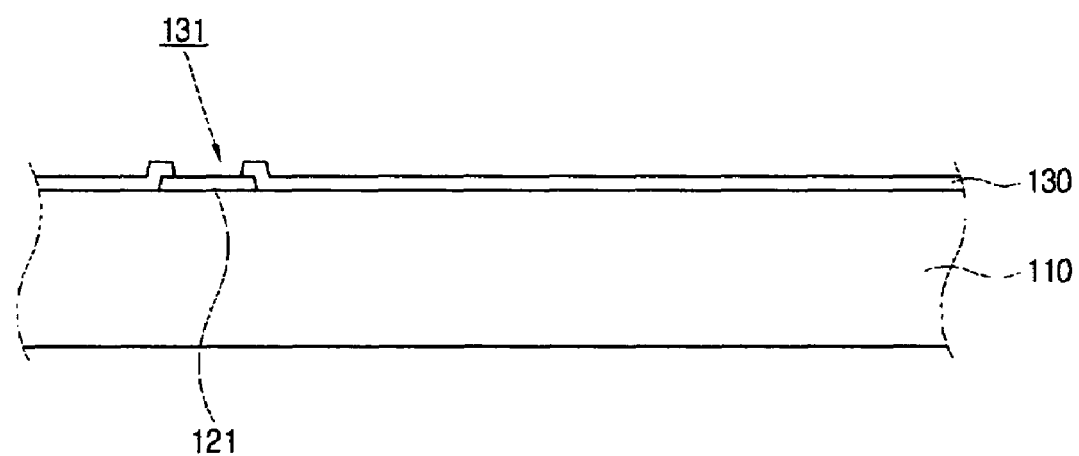

Referring to FIG. 3B, an intermediate insulating material comprising an inorganic material such as silicon nitride (SiNx) or silicon oxide (SiOx) is deposited on insulating substrate 110 and the data conductor 121, 123 to form the intermediate insulating layer 130. In another exemplary embodiment, an intermediate insulating layer may be an organic layer. In this case, the intermediate insulating layer 130 is formed on insulating substrate 110 by a spin coating method, a screen printing method or the like. Intermediate insulating layer 130 may comprise an organic layer and an inorganic layer. Insulating layer contact hole 131 is formed by an etching process to expose the portion of the data line 121, using a photoresist organic layer as a wall.

Figure 3C:
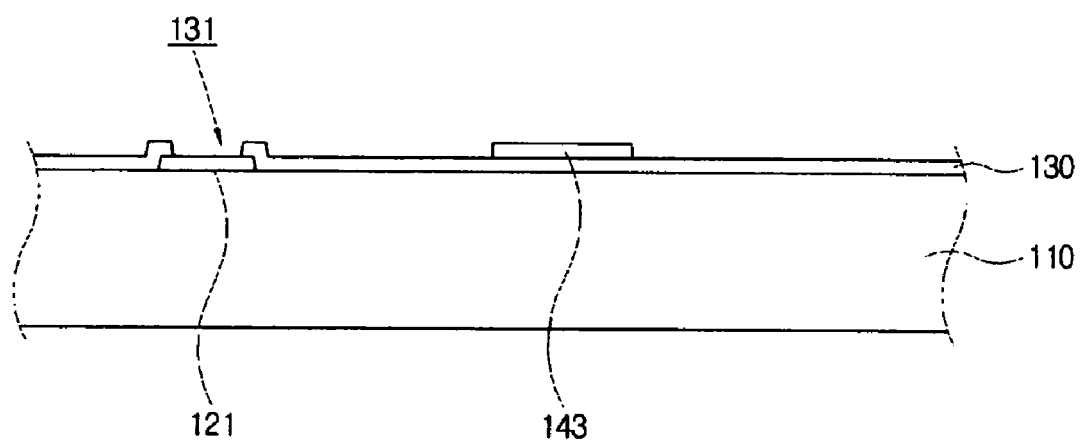

Referring to FIG. 3C, a gate conductor material comprising at least one of Al, Cr, Mo, Au, Pt, Pd, Cu and AlNd is deposited on intermediate insulating layer 130 by a sputtering method or the like and etched by photolithography to form gate line 141 (See FIG. 1), gate electrode 143 and gate pad 145 (See FIG. 1).

Figure 3D:
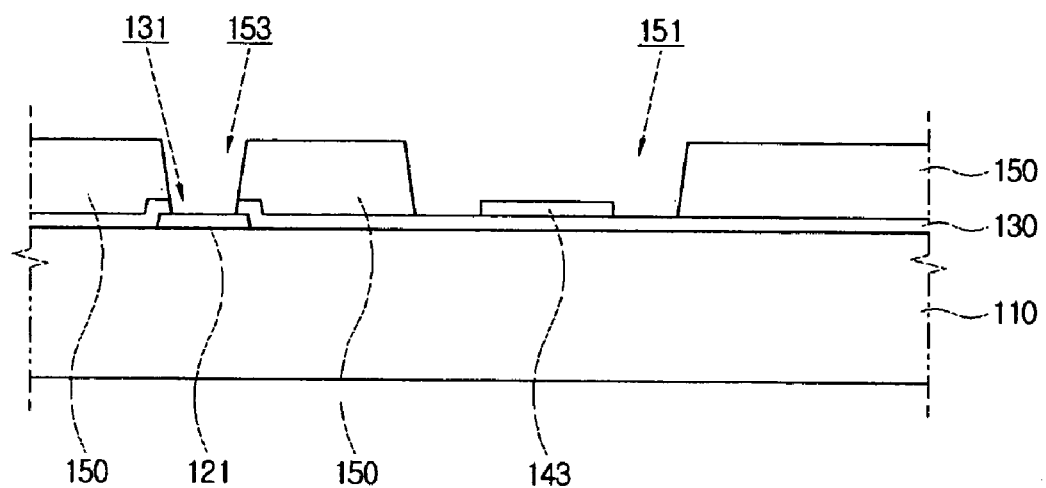

Referring to FIG. 3D, wall 150 is formed to have opening 151 exposing the gate electrode 143 and wall contact hole 153 exposing the portion of the data line 121 and corresponding to the insulating layer contact hole 131. Wall 150 may comprise a photoresist organic layer. Wall 150 is formed as follows: an organic layer with a predetermined thickness is formed by a spin coating method or a screen printing method on the intermediate insulating layer 130; the organic layer is aligned with a patterned photo mask and exposed; and the organic layer is developed to form opening 151 and wall contact hole 153.

Figure 3E:
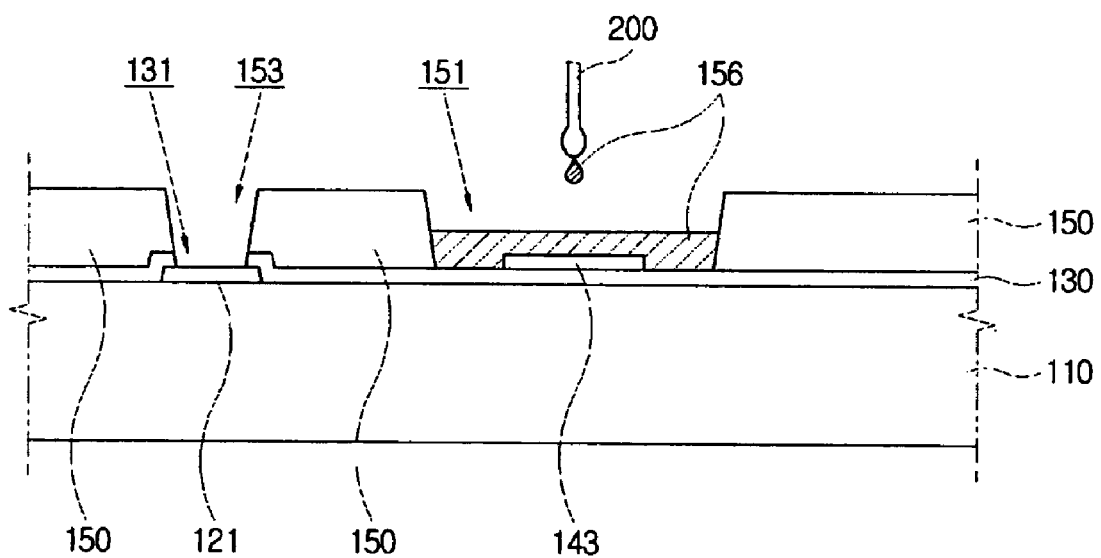
Figure 3F:
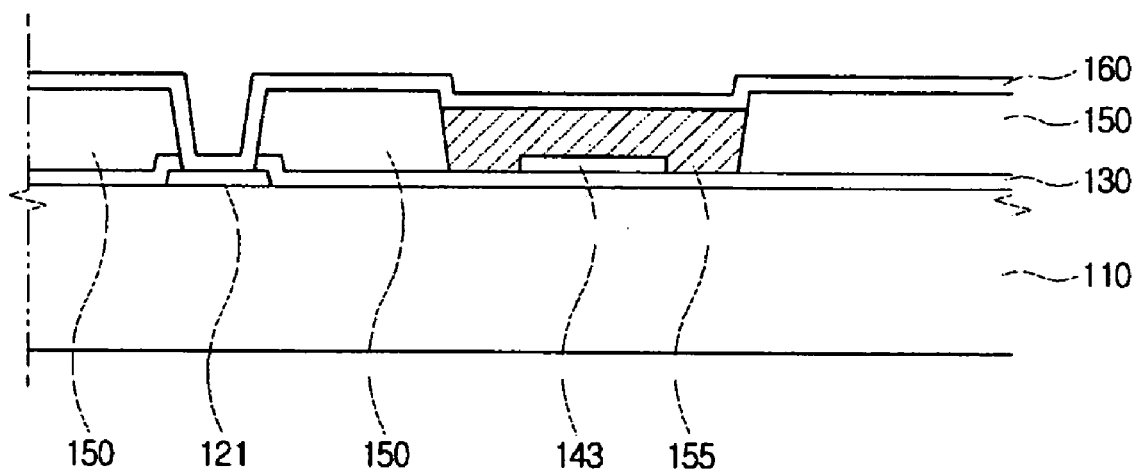

Referring to FIG. 3E, a nozzle 200 jets a gate insulating material 156 to opening 151. Gate insulating material 156 comprises at least one of acrylic resin, polystyrene resin and benzocyclobutene, which have low dielectric constant. Preferably, the gate insulating material 156 has relative dielectric constant between 1 and 3. This is to decrease capacitances Cgs and Cgd between the source electrodes 161, 171 and the gate electrode 143 and between the drain electrodes 163, 173 and the gate electrode 143, thereby improving the characteristics of the organic TFT. Then, the solvent is removed from gate insulating material 156, thereby forming gate insulating layer 155 as shown in FIG. 3F. Opening 151 is preferred to be formed large enough to minimize the coffee stain effect that will adversely affect the TFT characteristics.

Referring to FIG. 3F, a metal material comprising at least one of Al, Cr, Mo, Au, Pt, Pd, Cu and AlNd is deposited on wall 150 and gate insulating layer 155 to form a metal material layer 160. The metal material layer 160 is formed by a sputtering method. The metal material layer 160 is connected to data line 121 through wall contact hole 153 and insulating layer contact hole 131. Here, it is preferable that the metal material layer 160 comprises aluminum since the aluminum does not react to an etchant. Thus, metal material layer 160 may be patterned without difficulty using selectivity of an etchant.

Figure 3G:
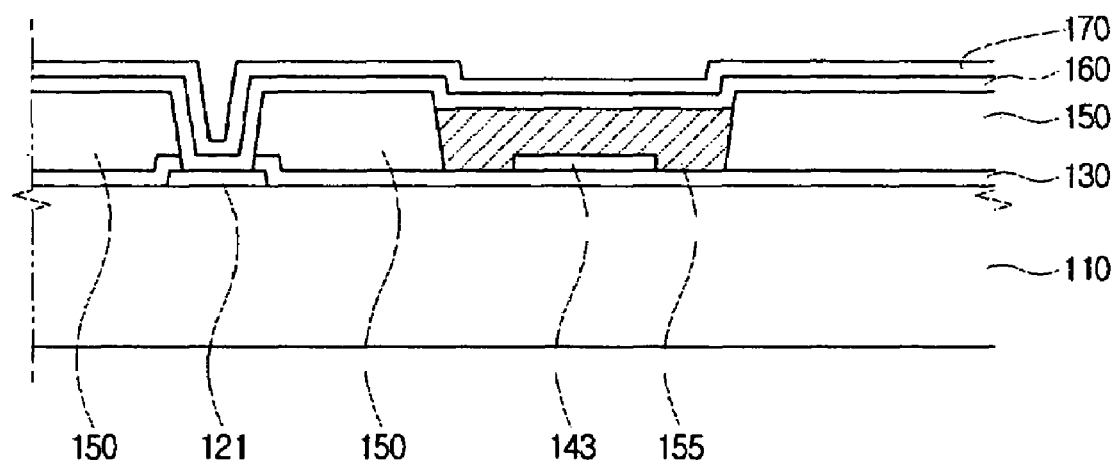

Referring to FIG. 3G, a transparent electrode material layer 170 is formed on metal material layer 160. Transparent electrode material layer 170 may be ITO or IZO. Preferably, transparent electrode material layer 170 is amorphous ITO. This is for easier patterning of the metal material layer 160 using the selectivity of the etchant used for patterning the metal material layer 160 and transparent electrode material layer 170.

Figure 3H:
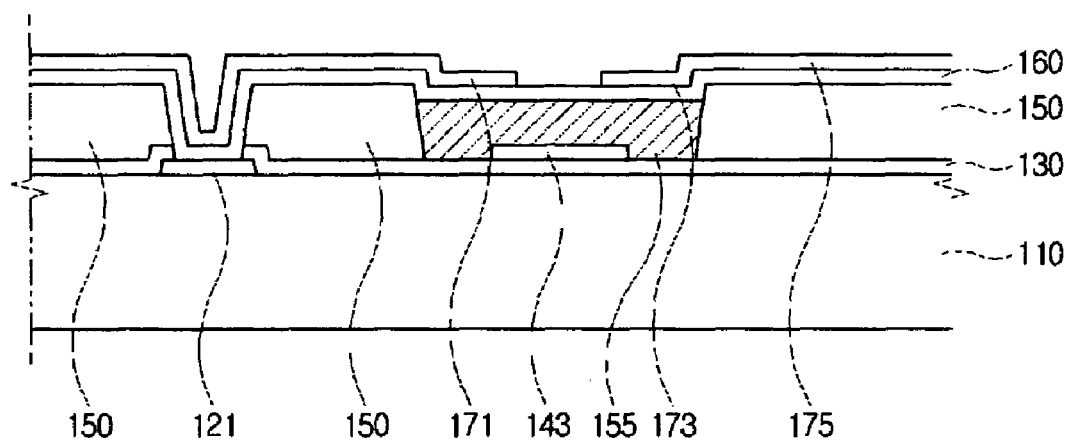
Figure 31:
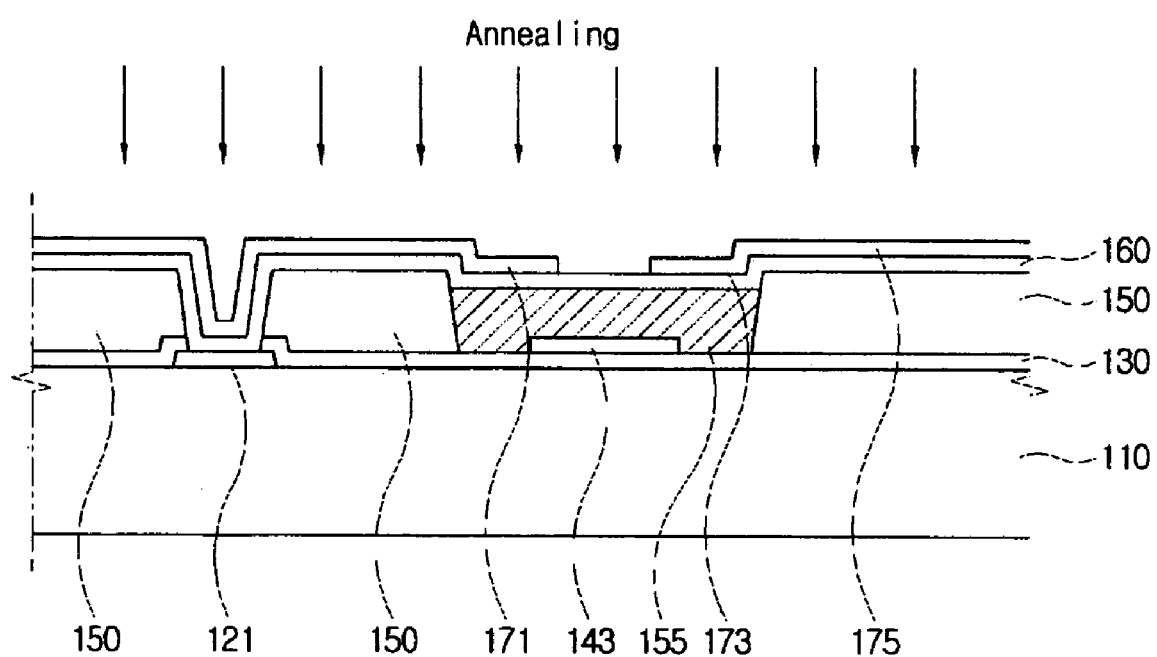

A photoresist layer (not shown) is formed on transparent electrode material layer 170 to form transparent electrode layers 171, 173, 175, 177 and 179, as shown in FIG. 3H. The photoresist layer is divided into two parts with respect to the gate electrode 143 and functions as a blocking layer to form the transparent electrode layers 171, 173, 175, 177 and 179. Here, data pad contact member 177 and gate pad contact member 179 are not shown in the drawing. Transparent electrode material layer 170 may be patterned by a chrome etchant to form transparent electrode layer 171, 173, 175, 177 and 179. Metal material layer 160 disposed below transparent electrode material layer 170 may be removed by the chrome etchant as well. Thus, it is necessary to monitor etching rate to selectively remove the transparent electrode material layer 170 comprising the amorphous ITO and not to remove metal material layer 160. Meanwhile, it is desirable that metal material layer 170 comprises aluminum. The aluminum does not react to the chrome etchant, and thus it is not necessary to monitor the etching rate. That means, the transparent electrode material layer 170 can be over-etched.

Referring to FIG. 3I, an annealing process is performed. In the annealing process, the material is heated sufficiently and cooled slowly to achieve a stable state. Through the annealing process, transparent electrode layers 171, 173, 175, 177 and 179 changes from an amorphous ITO to stable, polycrystal ITO.

Figure 3J:
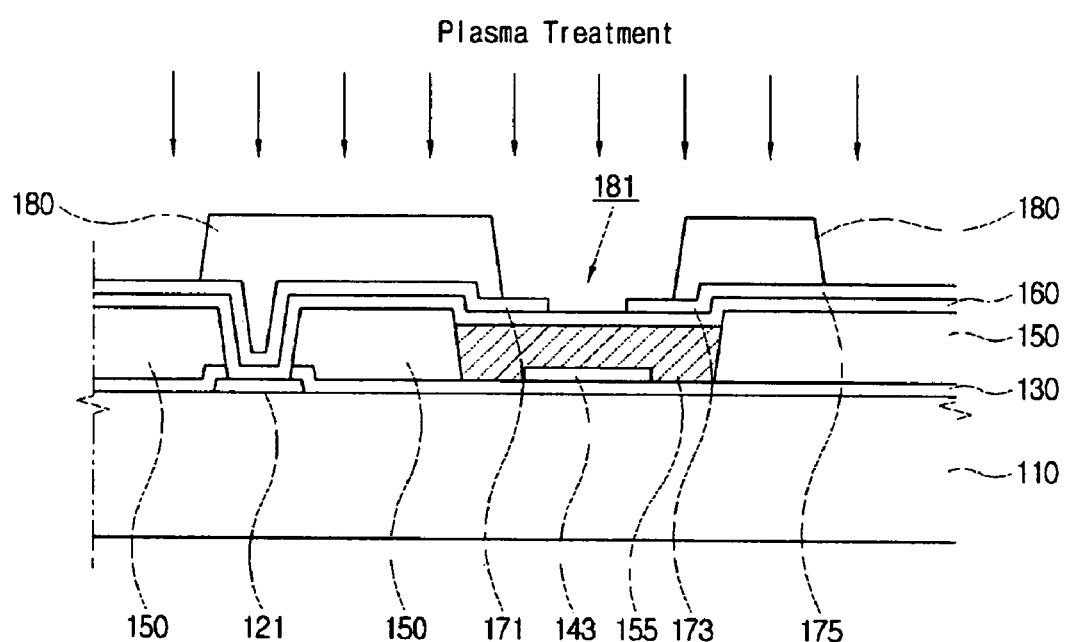

Referring to FIG. 3J, wall 180 is formed to encompass the channel region and to have opening 181 exposing a portion of the source electrode 171 and the portion of the drain electrodel 73. Wall 180 functions as a mold to form the organic semiconductor layer 190. Wall 180 may be a photoresist layer. Wall 180 is formed as follows: an organic layer with a predetermined thickness is formed on portions of the source electrode 171, the drain electrode 173 and the pixel electrode 195 by a spin coating method or a screen printing method; the organic layer is aligned and exposed with a patterned mask thereover; and the organic layer is developed to form opening 181 in wall 180 as shown in FIG. 3J.

The surface of wall 180 is treated for the spontaneous flow of the organic semiconductor solution 193 (refer to FIG. 3L) jetted on the surface of wall 180 into opening 181. In a conventional display device, however, the plasma surface treatment is performed while the channel region C is exposed thus adversely affecting gate insulating layer 155 and degrading the quality of the organic thin film transistor. Specifically, the surface treatment of gate insulating layer 155 provides water repellency and oil repellency against the organic semiconductor solution 193 and thus the organic semiconductor solution 193 does not spread uniformly but concentrates around source electrodes 161, 171 and the drain electrodes 163, 173. Thus, a good interface between gate insulating layer 155 and organic semiconductor layer 190 is not formed and organic semiconductor layer 190 does not have uniform thickness, thereby adversely affecting the characteristics of the organic thin film transistor.

Thus, in the present invention, referring to FIG. 3J, the surface of wall 180 is treated to have water repellency and oil repellency while the metal material layer 160 covers the channel region C. That is, as the metal material layer 160 covers the channel region C, the plasma and the chemical material cannot diffuse into the gate insulating layer 155, thereby improving the characteristics of the organic thin film transistor.

The surface treatment is performed by at least one of an $O_2$ plasma treatment process, a $CF_4$ plasma treatment process and a self-assembled monolayer (SAM) process. Here, the $O_2$ plasma treatment process and the $CF_4$ plasma treatment process are for the surface of wall 180 to obtain the water repellency and the oil repellency. On the other hand, the self-assembled monolayer process is used for an easy electric charges movement by decreasing contact resistance between the organic semiconductor layer 190 jetted to the channel region C and the source electrode 171 and the drain electrode 173 and, thereby enhancing the characteristics of the organic thin film transistor.

Figure 3K:
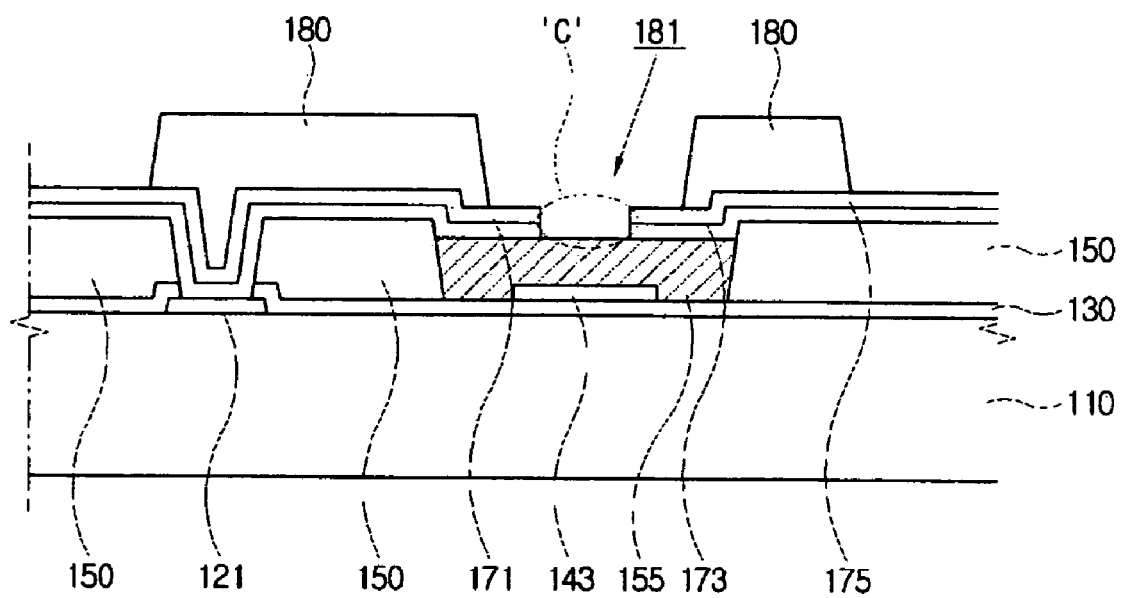

Referring to FIG. 3K, metal material layer 160 is patterned to form metal layer 161 and 163 which is divided into two parts across gate electrode 143. The metal material layer 160 may be patterned by a chrome etchant. Particularly, the transparent electrode layers 171, 173, 175, 177 and 179 comprising ITO which became polycrystal by the annealing process is not removed by the chrome etchant, and thus it operates as a shield to pattern metal material layer 160.

When metal material layer 160 is comprised of aluminum, it is preferably patterned by an aluminum etchant. Transparent electrode layers 171, 173, 175, 177 and 179 comprised of ITO which became polycrystal by the annealing process does not react to the aluminum etchant, and thus the metal material layer 160 may be easily patterned to form source electrode 161 and drain electrode 163 by dipping or washing.

In another embodiment, a photoresist layer or a basic element used for forming a wall may remain in the channel region C, and the basic element may deteriorate the characteristics of the organic thin film transistor. In the present invention, however, a weak acidic etchant is used to pattern the metal material layer 160, and thus the basic element remaining in the channel region is neutralized and is removed. Accordingly, an on-current and a mobility of an electric charge improve, thereby enhancing the characteristics of the organic thin film transistor.

Figure 2:
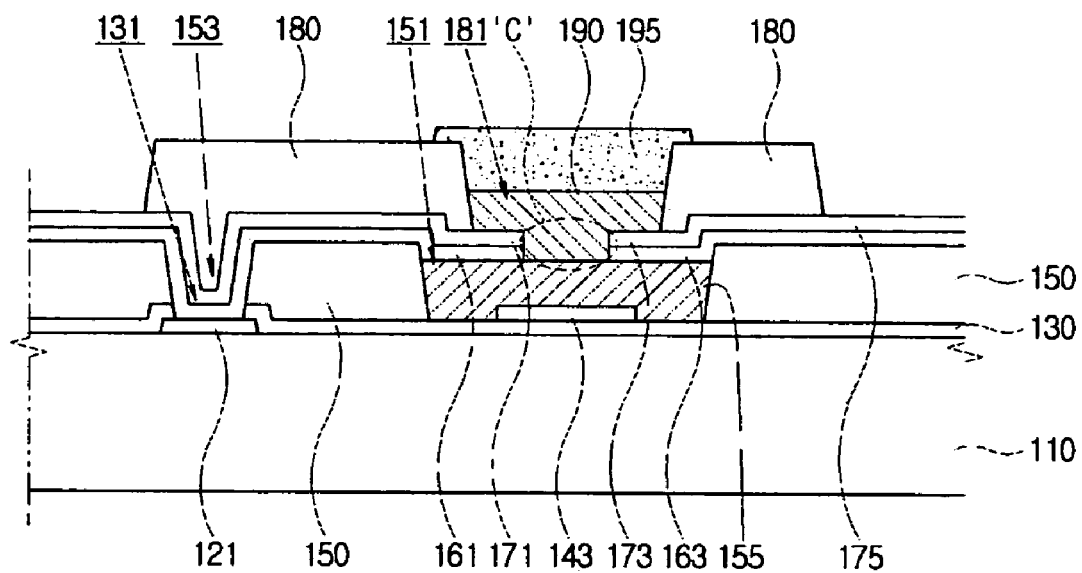
FIG. 2 is a sectional view, taken along line II-II in FIG. 1.
Figure 3L:
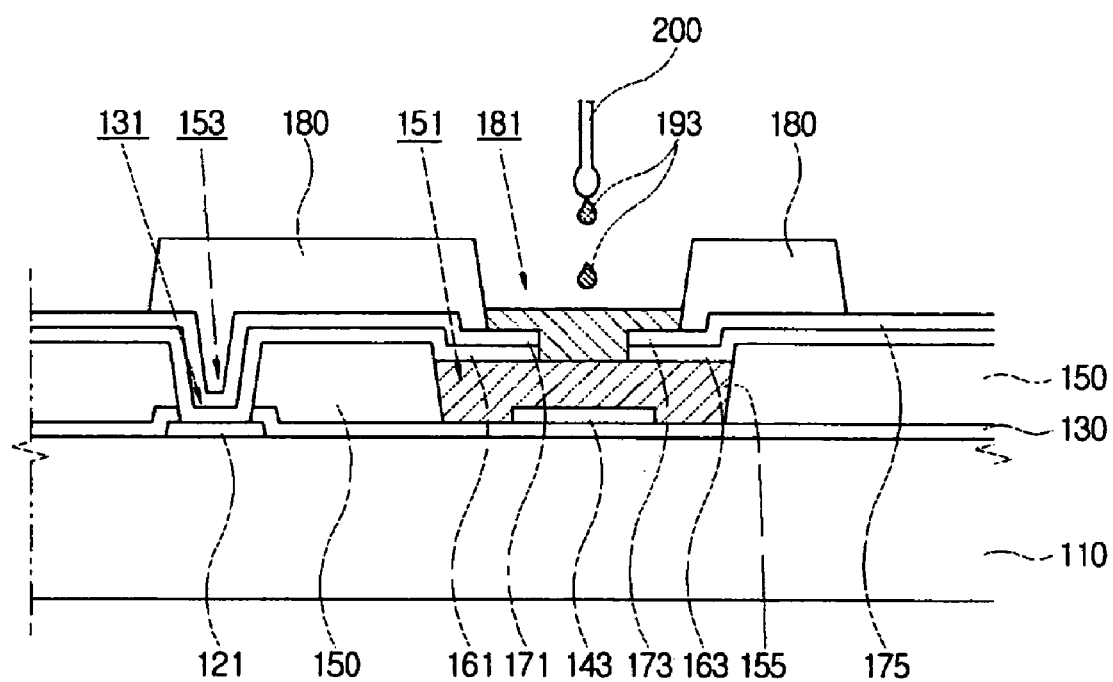

Referring to FIG. 3L, the organic semiconductor solution 193 is jetted through the nozzle 200 in the channel region C. The organic semiconductor solution 193 may be aqueous or oily depending on a solvent. The solvent is removed from the organic semiconductor solution 193, thereby forming organic semiconductor layer 190 (referring to FIG. 2). As organic semiconductor layer 190 may be patterned by an ink-jet method without photolithography, it is protected from the chemical material used in the photolithography, thereby decreasingly deteriorating the characteristics thereof.

In another exemplary embodiment, an organic semiconductor layer may be formed by an evaporation method or a coating method. In this case, wall 180 is not necessary.

Likewise, a passivation layer (not shown) may be formed by jetting a passivation solution on the organic semiconductor layer 190. The passivation solution may be aqueous or oily depending on a solvent. A solvent is removed from the passivation solution, thereby forming the passivation layer 195. A surface of the passivation layer 195 is flat.

Hereinafter, a display device and a manufacturing method thereof according to a second embodiment of the present invention will be described with reference to FIG. 4. In the following descriptions, distinctive features of the display device and the manufacturing method according to the second embodiment will be mentioned.

Figure 4:
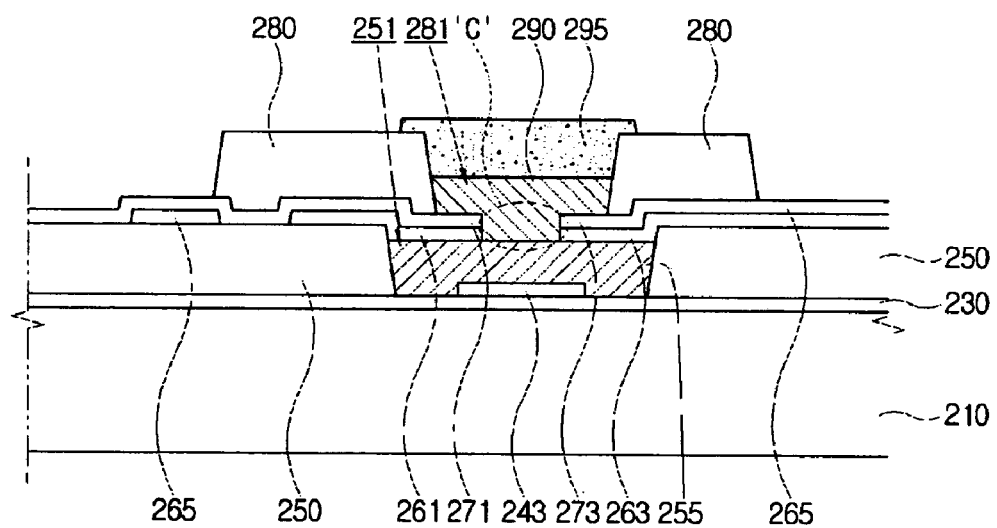
FIG. 4 is a sectional view of a display device according to a second embodiment of the present invention.

As shown in FIG. 4, a display device according to the second embodiment comprises a source electrode 261, 271 and a drain electrode 263, 273. The source electrode 261, 271 and the drain electrode 263, 273 each comprise a plurality of layers. The manufacturing process of the source electrode 261, 271 and the drain electrode 263, 273 according to the second embodiment is the same as one according to the first embodiment, thereby improving characteristics of an organic thin film transistor as described above. In the second embodiment, a data conductor 265 is formed on the same layer as metal layer 261 and 263. That is, a metal material layer (not shown) is formed and patterned to form data conductor 265. Next, a transparent electrode material layer is formed thereon, as aforementioned, and patterned to form transparent electrode layers 271, 273, 275, 277 and 279. Then, wall 280 is formed, and the surface thereof is treated. Metal layer 261 and 263 is formed by using transparent electrode layers 271, 273, 275, 277 and 279 as a blocking layer. Metal layer 261 and 263 is divided into two parts with respect to gate electrode 243. Accordingly, the process of patterning a data conductor, a process of forming an intermediate insulating layer and a process of forming an insulating layer contact hole may be omitted in the second embodiment, as compared with the first embodiment. Further, as the surface of the second wall 280 is treated to have water repellency and oil repellency while the metal material layer (not shown) covers channel region C, the plasma and chemical material used for the surface treatment cannot diffuse into gate insulating layer 255, thereby improving the characteristics of the organic thin film transistor.

The wall according to the present invention may be used for a display device such as a liquid crystal display (LCD), an organic light emitting diode (OLED), an electro-phoretic indication display or the like.

The OLED is a self light-emitting device using an organic material receiving an electric signal to emit light. In the OLED are layered a cathode layer (pixel electrode), a hole-injection layer, a hole-transfer layer, a light-emitting layer, an electron-transfer layer, an electron-injection layer, and an anode layer (counter electrode). A drain electrode on the TFT substrate according to the present invention is electrically connected to the cathode layer to apply a data signal.

The electro phoretic indication display is a flat panel display used for an e-book. The electro phoretic indication display comprises a first substrate where a first electrode and TFTs are formed, a second substrate where a second electrode is formed, a fluid disposed between both substrates, and charged particles dispersed in the fluid. The charged particles are either positive or negative, and either black or white. If both electrodes facing each other are applied with voltage to form a potential difference therebetween, the charged particles move up and down to an electrode having opposite polarity. Accordingly, an observer perceives the reflected light in the charged particles incident from the outside. The electro phoretic indication display uses the principle of the observer's strong and weak perception of the charged particles color when they move up and down.

It will be apparent to those skilled in the art that various modifications and variations can be made without, however, departing from the spirit or scope of the invention.

What is claimed is:

1. A display device comprising:
   a gate conductor including a gate electrode formed on an insulating substrate;
   a first wall having a first opening exposing the gate electrode;
   a gate insulating layer formed on the gate electrode;
   a conductive layer comprising a plurality of layers including a source electrode and a drain electrode formed on the gate insulating layer and separated from each other across the gate electrode to define a channel region; and
   an organic semiconductor layer formed in the channel region,
   wherein the conductive layer comprises a metal layer and a transparent electrode layer.

2. The display device according to claim 1, wherein the transparent electrode layer is formed on the metal layer.

3. The display device according to claim 1, wherein the metal layer comprises at least one of aluminum (Al), chrome (Cr), molybdenum (Mo), aurum (Au), platinum (Pt), palladium (Pd), copper (Cu) and aluminum neodymium (AlNd).

4. The display device according to claim 3, wherein the transparent electrode layer comprises one of indium tin oxide (ITO) and indium zinc oxide (IZO).

5. The display device according to claim 4, wherein the metal layer and the transparent electrode layer are electrically connected with each other.

6. The display device according to claim 4, wherein the transparent electrode layer comprises a polycrystal material.

7. The display device according to claim 1, further comprising a data conductor disposed between the insulating substrate and the gate conductor, an intermediate insulating layer covering the data conductor.

8. The display device according to claim 7, wherein the gate insulating layer is disposed in the first opening.

9. The display device according to claim 7, further comprising a second wall having a second opening formed on the conductive layer to expose the channel region, a portion of the source electrode and a portion of the drain electrode.

10. The display device according to claim 9, wherein the organic semiconductor layer is disposed in the second opening.

11. The display device according to claim 10, wherein a passivation layer is formed on the organic semiconductor layer.

* * * * *